United States Patent
Yarus et al.

(10) Patent No.: US 11,879,316 B2
(45) Date of Patent: Jan. 23, 2024

(54) GEOSTATISTICAL ANALYSIS OF MICROSEISMIC DATA IN FRACTURE MODELING

(71) Applicant: Landmark Graphics Corporation, Houston, TX (US)

(72) Inventors: Jeffrey Marc Yarus, Houston, TX (US); Ashwani Dev, Houston, TX (US); Jin Fei, Houston, TX (US); Trace Boone Smith, Lafayette, LA (US)

(73) Assignee: Landmark Graphics Corporation, Houston, TX (US)

( * ) Notice: Subject to any disclaimer, the term of this patent is extended or adjusted under 35 U.S.C. 154(b) by 1207 days.

(21) Appl. No.: 16/331,643

(22) PCT Filed: Oct. 4, 2016

(86) PCT No.: PCT/US2016/055291
§ 371 (c)(1),
(2) Date: Mar. 8, 2019

(87) PCT Pub. No.: WO2018/067120
PCT Pub. Date: Apr. 12, 2018

(65) Prior Publication Data
US 2019/0277124 A1    Sep. 12, 2019

(51) Int. Cl.
*E21B 43/16* (2006.01)
*E21B 43/26* (2006.01)
(Continued)

(52) U.S. Cl.
CPC .............. *E21B 43/26* (2013.01); *E21B 43/16* (2013.01); *G01V 1/16* (2013.01); *G01V 1/288* (2013.01);
(Continued)

(58) Field of Classification Search
CPC ...................................................... E21B 43/16
See application file for complete search history.

(56) References Cited

U.S. PATENT DOCUMENTS

| | | | |
|---|---|---|---|
| 8,392,165 B2 | 3/2013 | Craig et al. | |
| 8,437,962 B2 | 5/2013 | Craig | |

(Continued)

FOREIGN PATENT DOCUMENTS

| | | |
|---|---|---|
| WO | WO 2014/055186 A1 | 4/2014 |
| WO | WO 2014/055931 A1 | 4/2014 |

(Continued)

OTHER PUBLICATIONS

International Search Report and The Written Opinion, dated Jun. 29, 2017, PCT/US2016/055291, 12 pages.

(Continued)

*Primary Examiner* — Hyun D Park
(74) *Attorney, Agent, or Firm* — Kilpatrick Townsend & Stockton LLP

(57) ABSTRACT

A method may comprise: modeling a complex fracture network within the subterranean formation with a mathematical model based on a natural fracture network map and measured data of the subterranean formation collected in association with a fracturing treatment of the subterranean formation to produce a complex fracture network map; importing microseismic data collected in association with the fracturing treatment of the subterranean formation into the mathematical model; identifying directions of continuity in the microseismic data via a geostatistical analysis that is part of the mathematical model; and correlating the directions of continuity in the microseismic data to the complex fracture network with the mathematical model to produce a microseismic-weighted (MSW) complex fracture network map.

20 Claims, 9 Drawing Sheets

(51) Int. Cl.
  *G01V 1/28* (2006.01)
  *G01V 1/50* (2006.01)
  *G01V 1/40* (2006.01)
  *G01V 1/16* (2006.01)
  *G06F 30/00* (2020.01)

(52) U.S. Cl.
  CPC .................. *G01V 1/40* (2013.01); *G01V 1/50* (2013.01); *G01V 2210/1234* (2013.01); *G01V 2210/646* (2013.01); *G01V 2210/65* (2013.01); *G01V 2210/665* (2013.01); *G06F 30/00* (2020.01)

(56) References Cited

U.S. PATENT DOCUMENTS

| | | | |
|---|---|---|---|
| 8,898,044 B2 | 11/2014 | Craig | |
| 9,176,245 B2 | 11/2015 | Craig | |
| 2007/0183260 A1* | 8/2007 | Lee | G01V 1/50 367/25 |
| 2007/0272407 A1 | 11/2007 | Lehman et al. | |
| 2009/0091573 A1* | 4/2009 | Shi | G01V 1/301 345/440 |
| 2010/0312529 A1* | 12/2010 | Souche | G01V 11/00 703/2 |
| 2013/0000895 A1 | 1/2013 | Walters et al. | |
| 2014/0188447 A1 | 7/2014 | Venkataraman et al. | |
| 2014/0372094 A1 | 12/2014 | Holland et al. | |
| 2015/0377005 A1 | 12/2015 | Garcia-Teijeiro et al. | |
| 2016/0202390 A1* | 7/2016 | Ramsay | E21B 43/00 703/6 |
| 2016/0266278 A1 | 9/2016 | Holderby et al. | |
| 2020/0309990 A1* | 10/2020 | Kumar | E21B 47/00 |

FOREIGN PATENT DOCUMENTS

| | | |
|---|---|---|
| WO | WO 2015/117118 A1 | 8/2015 |
| WO | WO 2015/187150 A1 | 12/2015 |

OTHER PUBLICATIONS

Jones et al., Fracture Detection Interpretation Beyond Conventional Seismic Approches, Search and Discovery Article #41035, AAPG Eastern Section meeting, Cleveland, OH, 2012.

Khair et al., Natural Fracture Networks Enhancing Unconventional Reservoirs' Producibility: Mapping & Predicting, Search and Discovery Article #41182, AAPG Annual Convention and Exhibition, Pittsburgh, PA 2013.

Rodriguez, Stochastic Simulation of Microseismic Events Not Recovered from Monitoring Records, Geoconvention 2012: Vision, May 14-18, 2012, pp. 1-5, Calgary, AB, Canada.

* cited by examiner

US 11,879,316 B2

GEOSTATISTICAL ANALYSIS OF MICROSEISMIC DATA IN FRACTURE MODELING

CROSS-REFERENCE TO RELATED APPLICATIONS

The present application is a U.S. National Stage patent application of International Patent Application No. PCT/US2016/055291, filed on Oct. 4, 2016, the benefit of which is claimed and the disclosure of which is incorporated herein by reference in its entirety.

BACKGROUND

The present application relates to methods and systems that for modeling fracture networks of subterranean formations.

Oil and gas wells produce oil, gas, and/or byproducts from subterranean petroleum reservoirs. Petroleum reservoirs, such as those containing oil and gas, typically include finite-dimensional, discontinuous, inhomogeneous, anisotropic, non-elastic (DIANE) rock formations. Such formations, in their natural state (prior to any fracturing treatment), typically include natural fracture networks. As used herein, the term "natural fracture network" refers to the collection of fractures, connected or disconnected, within a subterranean formation before any fracturing treatment. The fractures in a natural fracture network may have various sizes, shapes, and orientations.

During a hydraulic fracturing treatment, fluids are pumped under high pressure into a rock formation through a wellbore to cause or form fractures in the formations and increase permeability and production from the formation. Fracturing treatments (as well as production and other activities) can cause complex fracture patterns to develop within the formation. As used herein, the term "complex fracture network" refers to the collection of both natural fractures and induced fractures, connected or disconnected, within a subterranean formation. Complex fracture networks may include fractures that extend to the wellbore, along multiple azimuths, in multiple different planes and directions, along discontinuities in rock, and in multiple regions of a formation.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

The present application relates to methods and systems that use microseismic data when modeling fracture networks of subterranean formations.

Hydraulic fracturing treatments (also referred to herein as "fracturing treatments") are typically conducted to induce fractures in a subterranean formation, and to thereby enhance hydrocarbon productivity of the subterranean formation. The pressures generated by the fracturing treatment can induce low-amplitude or low-energy seismic events in the subterranean formation, known as microseismic events. As used herein, the term "microseismic event" refers to a micro-earthquake that originates as a result of changing the stress distribution within a subterranean formation, for example, in response to hydraulic fracturing treatments. Microseismic events may originate from, for example, rock slips, rock movements, rock fractures, or other events in the subterranean formation.

Microseismic events can be detected by sensors and relevant microseismic data collected for analysis. As used herein, the term "microseismic data" refers to the data collected by one or more sensors related to microseismic events and may include location and magnitude information about the microseismic event. Sensors may be placed in a plurality of locations relative to the wellbore, for example, in a wellbore in which the fracturing treatment is being conducted, in a well (e.g., an observation well, an injection well, or a production well) that the fracturing treatment is not being conducted in but that is sufficiently close to the fracture network to measure microseismic events, at the Earth's surface, buried shallowly (less than about 300 ft) and sufficiently close to the fracture network to measure microseismic events, and the like. In some cases, combinations of sensor placement can be used. Exemplary sensors that may be used at the surface, near the surface, or downhole may include, but are not limited to, geophones, accelerometers, fiber optic sensors, and the like, and any combination thereof. In some instances, more than one sensor (e.g., two or more geophones or one or more geophones in combination with one or more accelerometers) may be used in a sensor array.

Microseismic data may be collected in association with a fracturing treatment, which may be before the fracturing treatment begins, during the fracturing treatment, after the fracturing treatment has terminated, or any combination thereof. The fracturing treatment may result in, among other things, at least one fracture being created or extended within the subterranean formation.

The systems and methods of the present application correlate the microseismic data with a map of fracture networks derived from other measured data to enhance the accuracy of the fracture network map.

Figure 1:
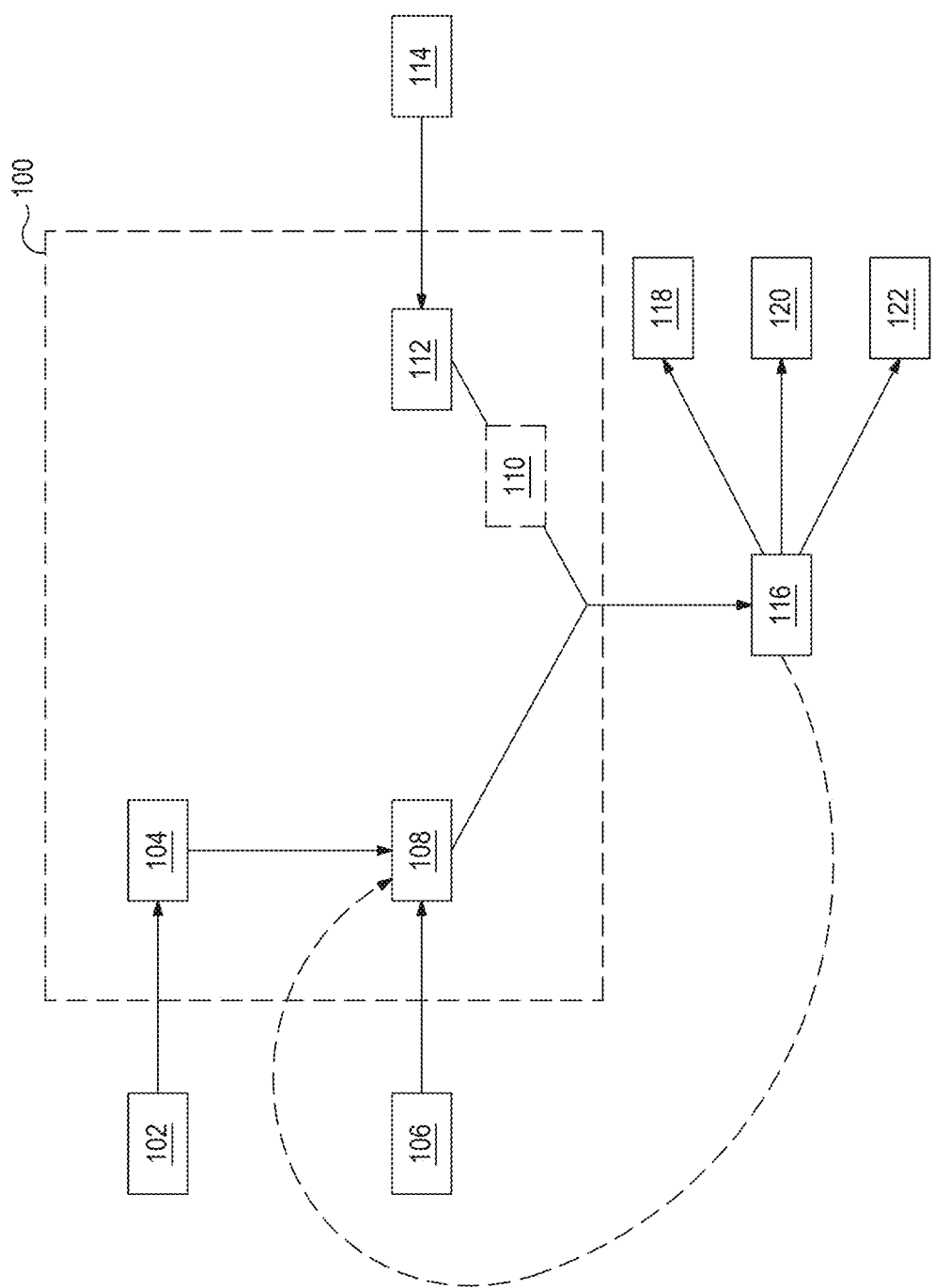
FIG. 1 is a flow diagram of a method that uses a mathematical model to correlate microseismic data with maps of fracture networks according to at least some embodiments of the present disclosure.

FIG. 1 is a flow diagram of a method that uses a mathematical model 100 to correlate microseismic data 114 with a map of the fracture network according to at least some embodiments of the present disclosure. The mathematical model 100 uses well log data 102 collected prior to a fracturing treatment to model a natural fracture network of a subterranean formation, for example, using a stochastic process, and produce a natural fracture network map 104. In some instances, additional mathematical analyses and manipulations may be performed prior to or during the modelling, which may include, but are not limited to, normalizing the well log data 102, calibrating the model, data cleaning of the well logs, and the like, and any combination thereof.

The well log data 102 may be from one or more measurements of the subterranean formation, for example, nuclear magnetic resonance measurements, gamma ray measurements, photoelectric measurements, neutron measurements, geochemical measurements, resistivity measurements, acoustic measurements, sonic measurements, borehole imaging measurements, and the like, and any combination thereof, which may be collected with measurement-while-drilling (MWD) and logging-while-drilling (LWD) tools, wireline tools, fiber optic tools, or combinations thereof.

The natural fracture network map 104 may be represented as a 3-dimensional grid matrix of the subterranean formation (also known as a geocellular grid), a 2-dimensional slice or topographical collapse of the 3-dimensional grid matrix, a 1-dimensional array representing the subterranean formation, and the like. In a 1-dimensional array, the data points of the formation (e.g., the data points in the geocellular grid) are converted to a mathematical matrix having matrix identification values corresponding to each of the data points in the geocellular grid.

The natural fracture network map 104 may be a map of one or more properties or characterizations of the subterranean formation that relate to the fractures in the natural fracture network. Exemplary properties or characterizations may include, but are not limited to, fault likelihood, curvature attributes, seismic impedance, and the like. As used herein, the term "fault likelihood" refers to a probability that a fault exists at a given location. In some instances, fault likelihood may be reported as a likelihood volume computed using the fault oriented semblance algorithm described by Hale (GEOPHYSICS, VOL. 78, NO. 2 (MARCH-APRIL 2013), P. O33-O43, *Methods to compute fault images, extract fault surfaces, and estimate fault throws from 3D seismic images*).

In association with the fracturing treatment of the subterranean formation, which may be before the fracturing treatment begins, during the fracturing treatment, after the fracturing treatment has terminated, or any combination thereof, additional data (referred to herein as measured data 106) may be gathered about the subterranean formation. The measured data 106 may be from, for example, nuclear magnetic resonance measurements, gamma ray measurements, density measurements, neutron measurements, geochemical measurements, resistivity measurements, acoustic measurements, sonic measurements, borehole imaging measurements, and the like, and any combination thereof, which may be collected with surface tools, MWD/LWD tools, wireline tools, fiber optic tools, or combinations thereof.

The mathematical model 100 uses the natural fracture network map 104 and the measured data 106 to model a complex fracture network, for example, using a stochastic process, and produce a complex fracture network map 108 that represents the fracture network after the fracturing treatment. In some instances, additional mathematical analyses and manipulations may be performed prior to or during the modelling, which may include, but are not limited to, normalizing the measured data 106, calibrating the model, data cleaning of the well logs, and the like, and any combination thereof.

The complex fracture network map 108 may be represented as a 3-dimensional grid matrix of the subterranean formation, a 1-dimensional array representing the subterranean formation, and the like and may be a map of one or more properties or characterizations of the subterranean formation that relate to the fractures therein including those described herein related to the natural fracture network map 104.

Further, in association with the fracturing treatment of the subterranean formation, microseismic data 114 may be gathered about the subterranean formation using surface sensors or downhole sensors as previously described. Exemplary microseismic data 114 may include, but are not limited to, magnitude of microseismic events, absolute time of microseismic events, relative time of microseismic events, mechanism of microseismic events, p-wave to s-wave ratios, signal to noise ratios, seismic moment, amount of shear associated with microseismic events, microseismic moment tensors, anisotropy of formation, location of the microseismic events, and the like, and any combination thereof. Further, the wellbore pressure, the formation stresses, or both may be measured and correlated with the microseismic data 114.

The mathematical model 100 may then apply a geostatistical analysis to the microseismic data 114 to identify directions of continuity 112 in microseismic data 114. The geostatistical analysis quantifies directions of anisotropic behavior and continuity in the microseismic data 114 and identifies patterns in the fracture azimuths and planes. More specifically, one exemplary geostatistical analysis involves applying a variogram to the microseismic data 114. As used herein, the term "variogram" refers to a function (e.g., EQ. 1) of the spatial correlation.

Figure 2:
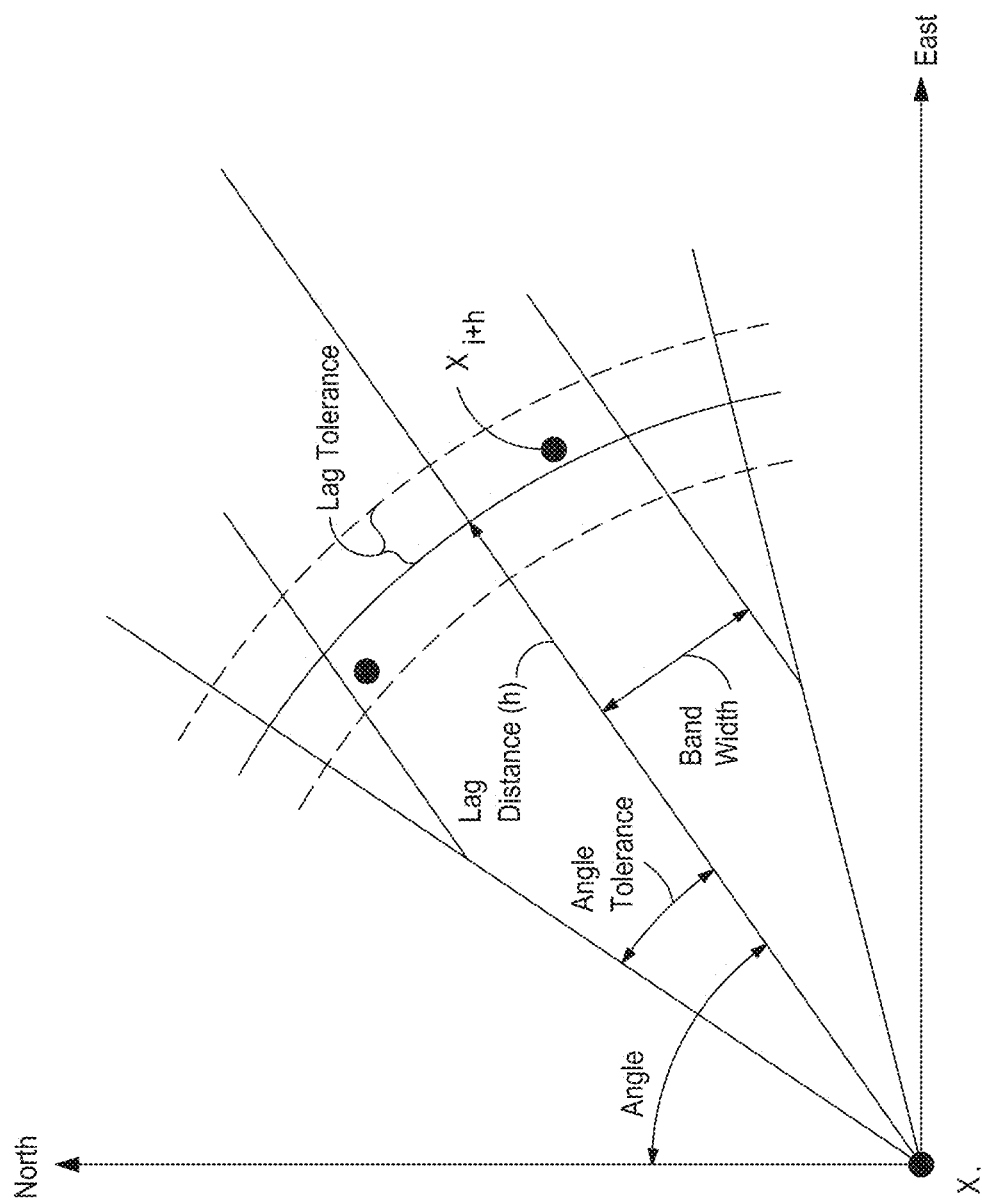
FIG. 2 is a representation of determining a horizontal variogram according to EQ. 1.

FIG. 2 is a representation of determining a horizontal variogram according to EQ. 1.

$$\gamma_{(h)} = \frac{\sum_{i=1}^{n}(X_i - X_{(i+h)})^2}{2n} \qquad \text{EQ. 1}$$

where: y is the semivariance h is the lag distance $X_i$ is the variable under consideration (microseismic data 114 for the analyses of the present disclosure) as a function of spatial location $X_{(i+h)}$ is the lagged version of the variable under consideration n is the number of pairs separated by the lag distance (h)

More specifically, FIG. 2 depicts the process for selecting pairs of data points to be used in the calculation of a variogram (geostatistical spatial model). The image is frozen in time at one step to illustrate the method. Point $X_i$ in the bottom left had corner is a data point being assessed. The object is to find all the other points that $X_i$ will be paired with given a specified distance and azimuth from $X_i$, and identify the distance interval (lag distance (h)) in which it occurs. An angle tolerance and lag tolerance are provided on the azimuth and lag distance, respectively, to allow for modest deviations. In addition, a band with is included on the azimuth tolerance angle to restrict the search from deviating too far from the specified azimuth. The illustration identifies two points that will be pairs, one of which is labeled $X_i$+h is identified to occur within the azimuth tolerance and in a specific lag interval (lag+tolerance) depicted by the dashed lines. The process is repeated at every data point until all possible pairs are identified and assigned to their appropriate lag interval.

The variograms from the geostatistical analysis may be used to identify directions of continuity 112 in microseismic data 114, which is described in more detail in the Examples.

Referring again to FIG. 1, in some instances, additional mathematical analyses and manipulations may be performed prior to or during the geostatistical analysis, which may include, but are not limited to, normalizing the microseismic data 114, validating the geostatistical analysis (as described in US Patent Application Publication No. 2010/0121622), and the like, and any combination thereof.

Optionally, the directions of continuity 112 may be used to produce a microseismic map 110 of the subterranean formation, which may be represented as a 3-dimensional grid matrix of the subterranean formation, a 1-dimensional array representing the subterranean formation, and the like. In some instances, a model, for example, using a stochastic process, may be used when producing the microseismic map 110.

The mathematical model 100 then correlates the directions of continuity 112 (optionally represented as the microseismic map 110) and the complex fracture network map 108, an example of which is provided in the Examples. This correlation interprets fracture planes by comparing the locations of the directions of continuity 112 to locations of the fractures (especially newly formed or extended fractures) in the complex fracture network map 108 and weights the fractures that correspond to directions of continuity 112 as having a higher probability of being present. The result of correlating the directions of continuity 112 and the complex fracture network map 108 is a microseismic-weighted (MSW) complex fracture network map 116.

The MSW complex fracture network map 116 may be represented as a 3-dimensional grid matrix of the subterranean formation, a 1-dimensional array representing the subterranean formation, and the like and may be a map of one or more properties or characterizations of the subterranean formation that relate to the fractures therein including those described herein related to the natural fracture network map 104. In some instances, a stochastic process appropriately adapted to weight the correspondence between the directions of continuity 112 and the complex fracture network map 108 may be used to produce the MSW complex fracture network map 116.

The MSW complex fracture network map 116 that results from the mathematical model 100 may be used for further analysis and/or modelling of the subterranean formation. For example, the MSW complex fracture network map 116 may be used as the basis for estimating the hydrocarbon production 118 of the subterranean formation. In another example, the MSW complex fracture network map 116 may be used for identifying a location for drilling a second wellbore 120 into the subterranean formation so that the second wellbore intersects the complex fracture network in the subterranean formation. In yet another example, the MSW complex fracture network map 116 may be used for determining the parameters of a subsequent fracturing treatment 122 of the subterranean formation. In some instances, two or more of the foregoing examples may be performed using the MSW complex fracture network map 116.

In yet another example, which may be separate from or together with one or more of the foregoing example, the MSW complex fracture network map 116 may be used as an input to the mathematical model 100 in place of the natural fracture network 104 when a subsequent fracturing treatment is performed. That is, the mathematical model 100 may be performed again where the complex fracture network map 108 is based on the MSW complex fracture network map 116 and the measured data 106 associated with a subsequent fracturing treatment to produce a second MSW complex fracture network map, which may be used for estimating the hydrocarbon production of the subterranean formation, identifying a location for drilling a second wellbore, determining the parameters of a subsequent fracturing treatment, performing the mathematical model 100 again, and any combination thereof.

The analyses and methods described herein may be implemented by a set of instructions that cause a processor to perform the mathematical model 100. In some instances, the processor and set of instructions may also be used for subsequent analyses of the MSW complex fracture network map 116 like estimating the hydrocarbon production of the subterranean formation, identifying a location for drilling a second wellbore, determining the parameters of a subsequent fracturing treatment, performing the mathematical model 100 again, and any combination thereof.

The processor may be a portion of computer hardware used to implement the various illustrative blocks, modules, elements, components, methods, and algorithms described herein. The processor may be configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to the processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Figure 3:
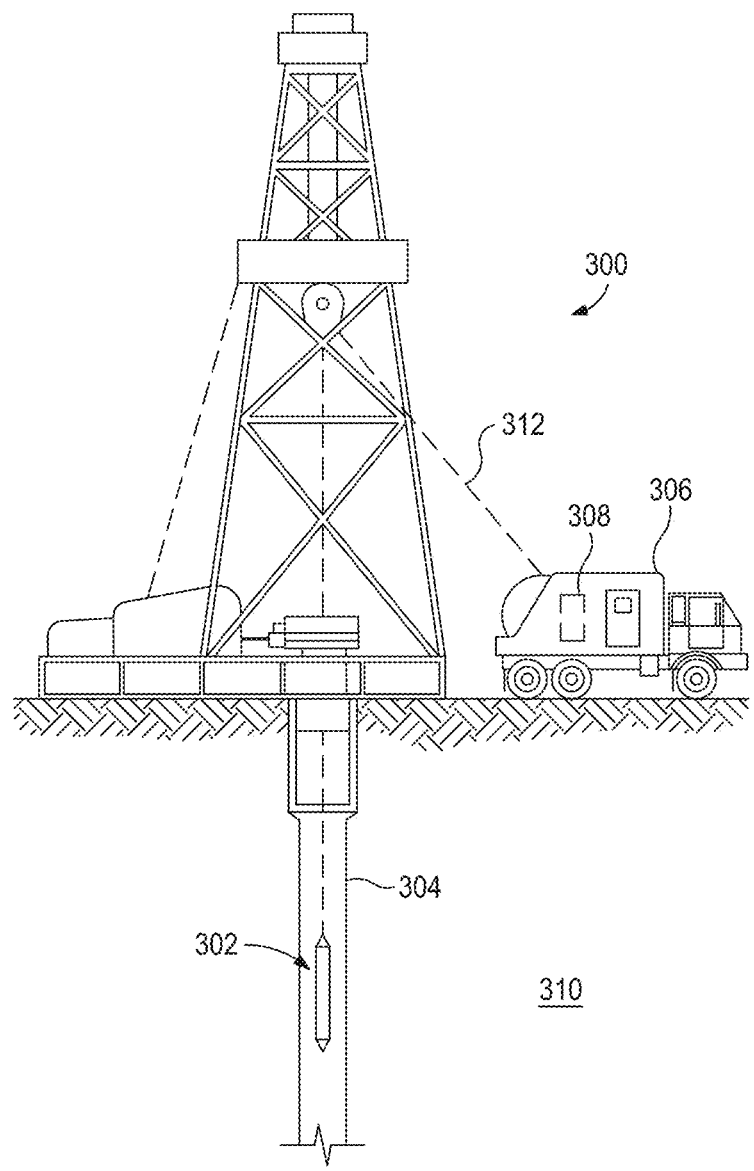
FIG. 3 depicts a schematic diagram of an exemplary wireline system that may employ the principles of the present disclosure.

FIG. 3 depicts a schematic diagram of an exemplary wireline system 300 that may employ the principles of the present disclosure, according to one or more embodiments. At various times before, during, or after a fracturing treatments, well log data 102, measured data 106, and microseismic data 114 of FIG. 1 may be collected for a subterranean formation 310. In some instances, the wellbore tools extending into a wellbore 304 (e.g., a work string for perforating the formation 310) may be removed from a wellbore 304 to conduct measurement/logging operations. As illustrated, the wireline system 300 may include a one or more wireline tools 302 that may be suspended into the wellbore 304 by a cable 312. The wireline tools 302 may be communicably coupled to the cable 312. The cable 312 may include conductors for transporting power to the wireline tools 302 and also facilitate communication between the surface and the wireline tools 302. A logging facility 306, shown in FIG. 3 as a truck, may collect measurements from the wireline tools 302, and may include computing facilities 308 for controlling, processing, storing, and/or visualizing the measurements gathered by the wireline tools 302. The computing facilities 308 may be communicably coupled to the wireline tools 302 by way of the cable 312. In some instances, the mathematical model 100 of FIG. 1 may be implemented using the computing facilities 308. Alternatively, the measurements gathered by the wireline tools 302 may be transmitted (wired or wirelessly) or physically delivered to computing facilities off-site where the mathematical model 100 of FIG. 1 may be implemented.

Figure 4:
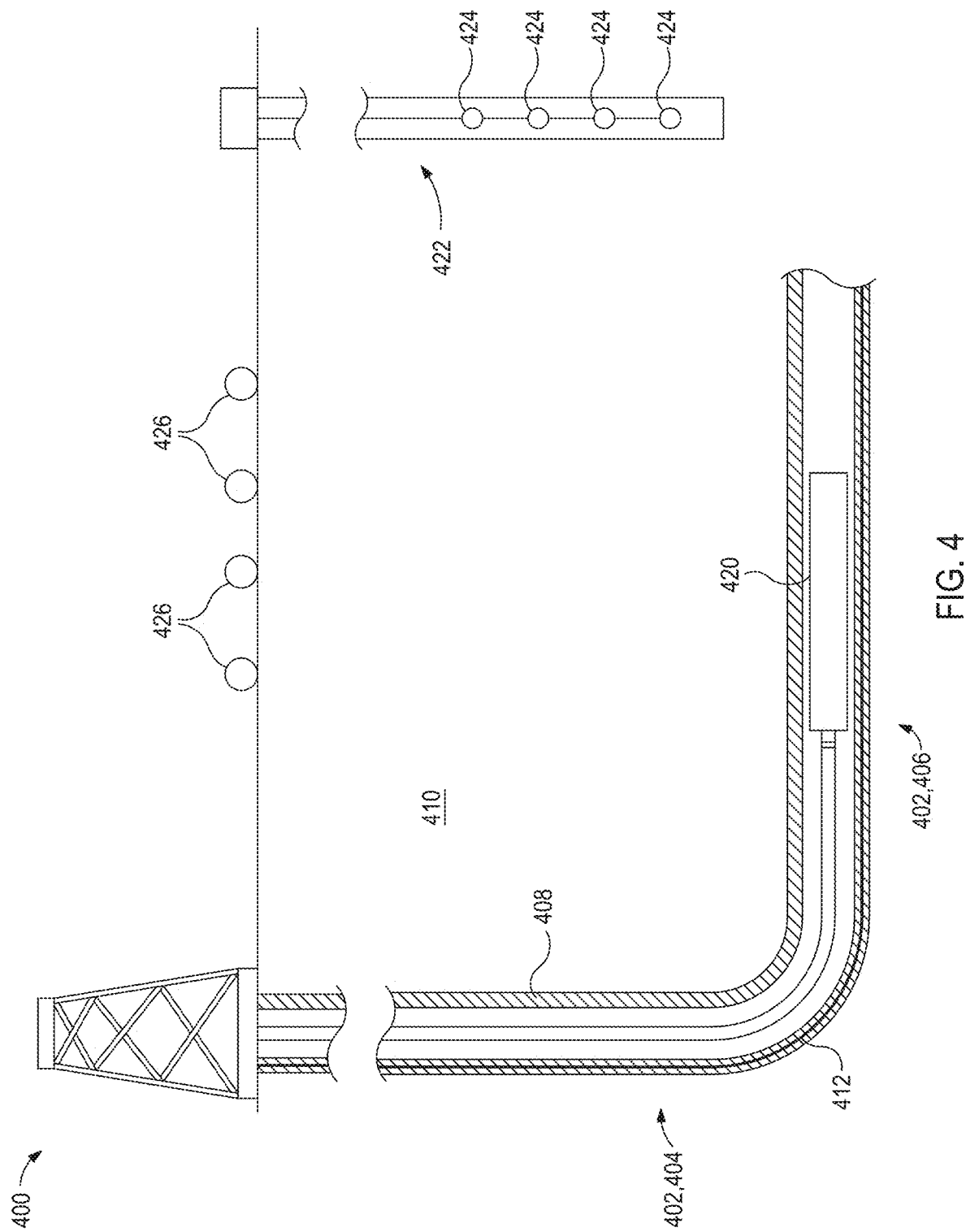
FIG. 4 depicts a schematic diagram of an exemplary system including a horizontal well that may employ the principles of the present disclosure.

FIG. 4 depicts a schematic diagram of an exemplary system 400 that may employ the principles of the present disclosure, according to one or more embodiments. In the illustrated system 400, a wellbore 402 with a vertical section 404 and a horizontal section 406 is lined with the casing 408 cemented therein to support the wellbore 402. Alternatively, a portion of the wellbore 402 may not have a casing, which is referred to as "open hole." For example, the casing 408 may extend from a surface location, such as the Earth's surface, or from an intermediate point between the surface location and the formation 410. In the illustrated system 400, a fiber optic cable 412 extends along the casing 408.

One or more wellbore tools 420, for example, a completion assembly or perforating gun, may be used to prepare the horizontal section 406 for the subsequent extraction of hydrocarbons from the surrounding formation 410. For example, a completion assembly may include a plurality of packers that isolate the various production intervals in the horizontal section 406. In some instances, a fluid (e.g., a stimulation fluid, a treatment fluid, an acidizing fluid, a conformance fluid, or any combination thereof) may be injected into the wellbore 402 or surrounding formation 410 via the wellbore tools 420.

The system 400 also includes an observation well 422 that has a plurality of geophones 424 placed therein for measuring seismic and/or microseismic data. Further, the system 400 includes a plurality of surface geophones 426 for measuring seismic and/or microseismic data.

Embodiments of the present disclosure include, but are not limited to, Embodiment A, Embodiment B, and Embodiment C.

Embodiment A is a method comprising: modeling a complex fracture network within the subterranean formation with a mathematical model based on a natural fracture network map and measured data of the subterranean formation collected in association with a fracturing treatment of the subterranean formation to produce a complex fracture network map; importing microseismic data collected in association with the fracturing treatment of the subterranean formation into the mathematical model; identifying directions of continuity in the microseismic data via a geostatistical analysis that is part of the mathematical model; and correlating the directions of continuity in the microseismic data to the complex fracture network with the mathematical model to produce a microseismic-weighted (MSW) complex fracture network map.

Embodiment B is a system comprising: a wellbore tool placed along a wellbore extending into a subterranean formation; a non-transitory computer-readable medium coupled to the wellbore tool to receive measured data of the subterranean formation from the wellbore tool collected in association with a fracturing treatment of the subterranean formation and encoded with instructions that, when executed, perform the method of Embodiment A.

Embodiment C is a non-transitory computer-readable medium encoded with instructions that, when executed, perform the method of Embodiment A.

Embodiments A, B, and C may further comprise one or more of the following: Element 1: the method further comprising: producing the natural fracture network map by modeling a natural fracture network within the subterranean formation with the mathematical model based on a well log of the subterranean formation; Element 2: the method further comprising: developing a parameter of a subsequent wellbore operation based on the MSW complex fracture network map; Element 3: the method further comprising: identifying a location for drilling a second wellbore into the complex fracture network; Element 4: the method further comprising: identifying a location for drilling a second wellbore into the complex fracture network and drilling the second wellbore; Element 5: the method further comprising: estimating a hydrocarbon production amount based on the MSW complex fracture network map; Element 6: the method further comprising: estimating a hydrocarbon production amount based on the MSW complex fracture network map and producing hydrocarbons from the subterranean formation; Element 7: the method further comprising: determining parameters for a subsequent fracturing treatment of the subterranean formation based on the MSW complex fracture network map; Element 8: the method further comprising: determining parameters for a subsequent fracturing treatment of the subterranean formation based on the MSW complex fracture network map and performing the subsequent fracturing treatment with the parameters; Element 9: the method further comprising: fracturing the subterranean formation a second time via a second fracturing network to produce a second complex fracture network; modeling the second complex fracture network based on the MSW complex fracture network map and second measured data of the subterranean formation collected in association with the second fracturing treatment; importing second microseismic data collected in association with the second fracturing treatment of the subterranean formation into the mathematical model; identifying second directions of continuity in the second microseismic data via the geostatistical analysis; and correlating the second directions of continuity in the second microseismic data to the second complex fracture network with the mathematical model to produce a second MSW complex fracture network map; Element 10: wherein the measured data of the subterranean formation is selected from the group consisting of: seismic data, gravimetric data, magnetic data, magnetotelluric data, and any combination thereof; and Element 11: wherein modeling the natural fracture network involves calculating a fault likelihood with the mathematical model. Exemplary combinations may include, but are not limited to, Element 1 in combination with one or more of Elements 2-11; Elements 10 and 11 in combination and optionally in further combination with one or more of Elements 1-9; Elements 7 or 8 in combination with Elements 5 or 6; Elements 3 or 4 in combination with Elements 5 or 6; and the like.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

To facilitate a better understanding of the embodiments of the present invention, the following examples of preferred or representative embodiments are given. In no way should the following examples be read to limit, or to define, the scope of the invention.

EXAMPLES

Data was collected for a subterranean formation in the Permian Basin including well log data 102, measured data 106 (borehole image), and microseismic data 114 (the magnitude of microseismic events) of FIG. 1. The following describes in more detail some of the data analyses and correlations performed by the mathematical model 100.

Figure 5:
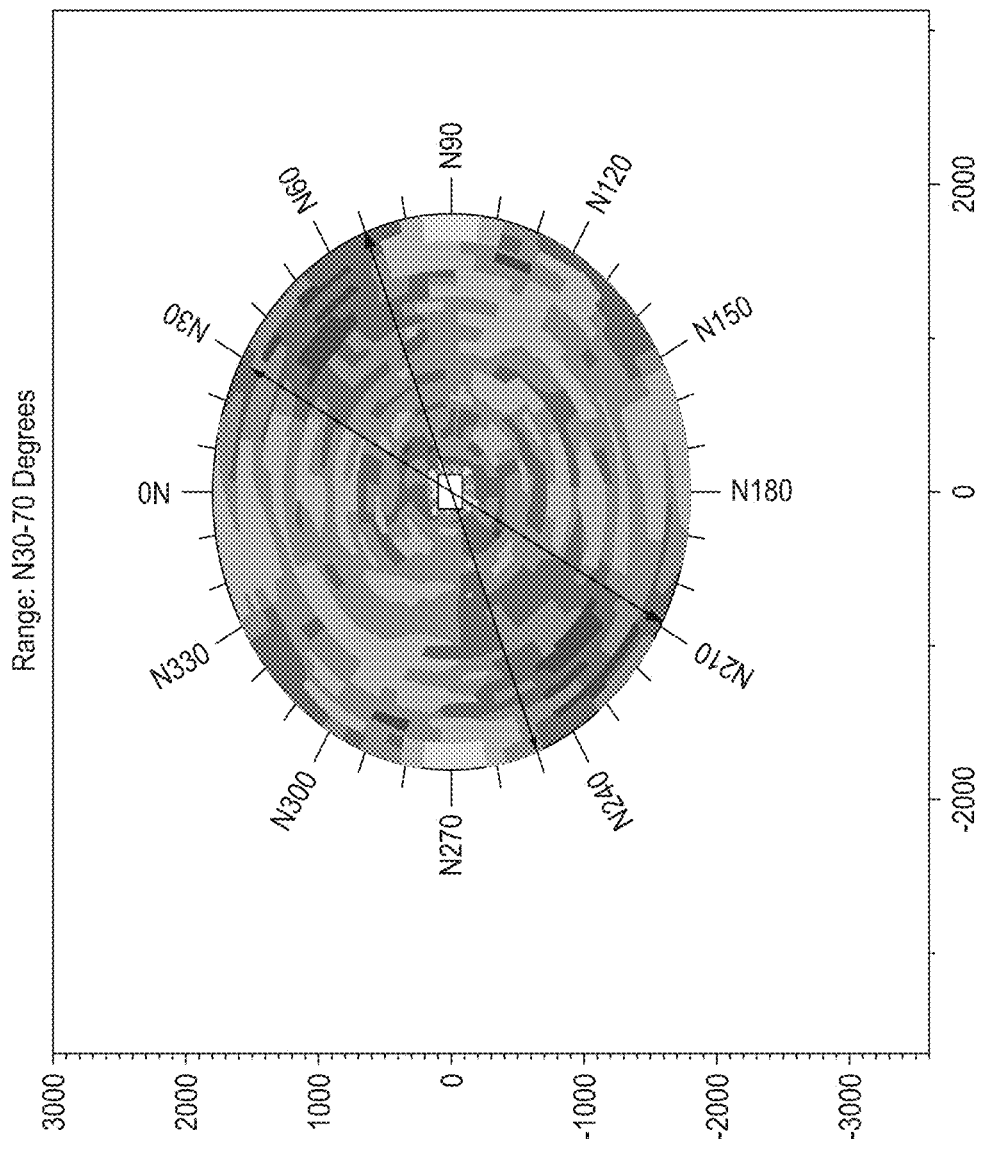
FIG. 5 is a polar plot of the semivariance derived from the microseismic data using a geostatistical analysis.

FIG. 5 is a polar plot of the semivariance (y) derived from the microseismic data using a geostatistical analysis, specifically, applying EQ. 1 to the 360° of microseismic data 114 collected. The polar plot has two areas of high semivariance that are generally in the 45° and 230° directions and bracketed by the solid arrows superimposed on the graph. The polar also has a weaker line of semivariance that extends from the 150° to 330° directions. These areas or lines of increased semivariance may indicate the directions of continuity 112 in the microseismic data 114 described in FIG. 1.

Figure 7:
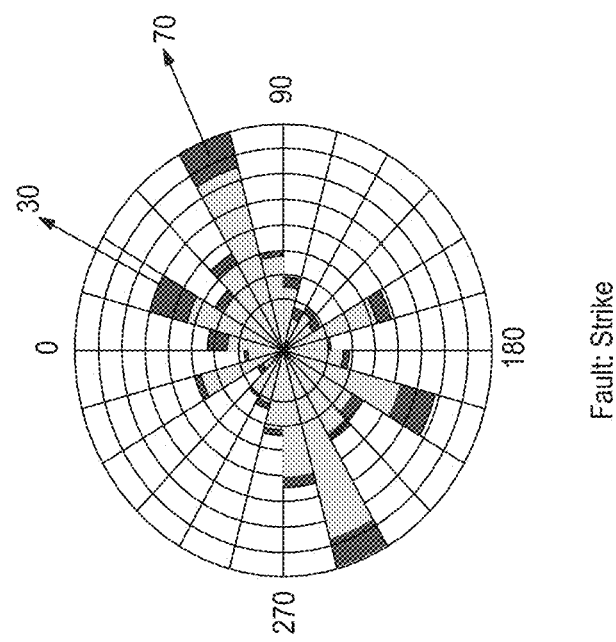
FIGS. 6 and 7 are plots of the fault likelihood of the dip azimuth and the strike azimuth, respectively, as derived from borehole image measured data.
Figure 6:
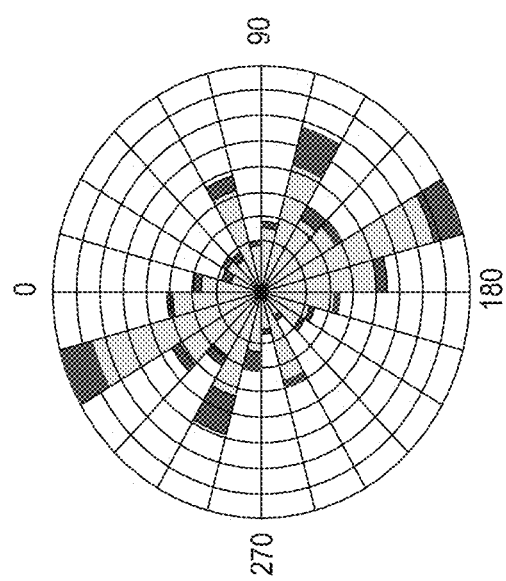

The borehole image measured data 106 was used to derive the fault likelihood of the dip azimuth and the strike azimuth, which are illustrated in FIGS. 6 and 7. The fault likelihood of the dip azimuth and the strike azimuth provide indications of where the fractures are within the fracture network. More specifically, the "dip azimuth" is the inclination angle and quadrant direction perpendicular to the "strike azimuth," which is the horizontal line in the structural plane (or fracture). The illustrated plots in FIGS. 6 and 7 illustrate that the borehole image measured data 106 indicates that fractures may be located at 30°, 70°, 220°, and 255°.

Figure 8:
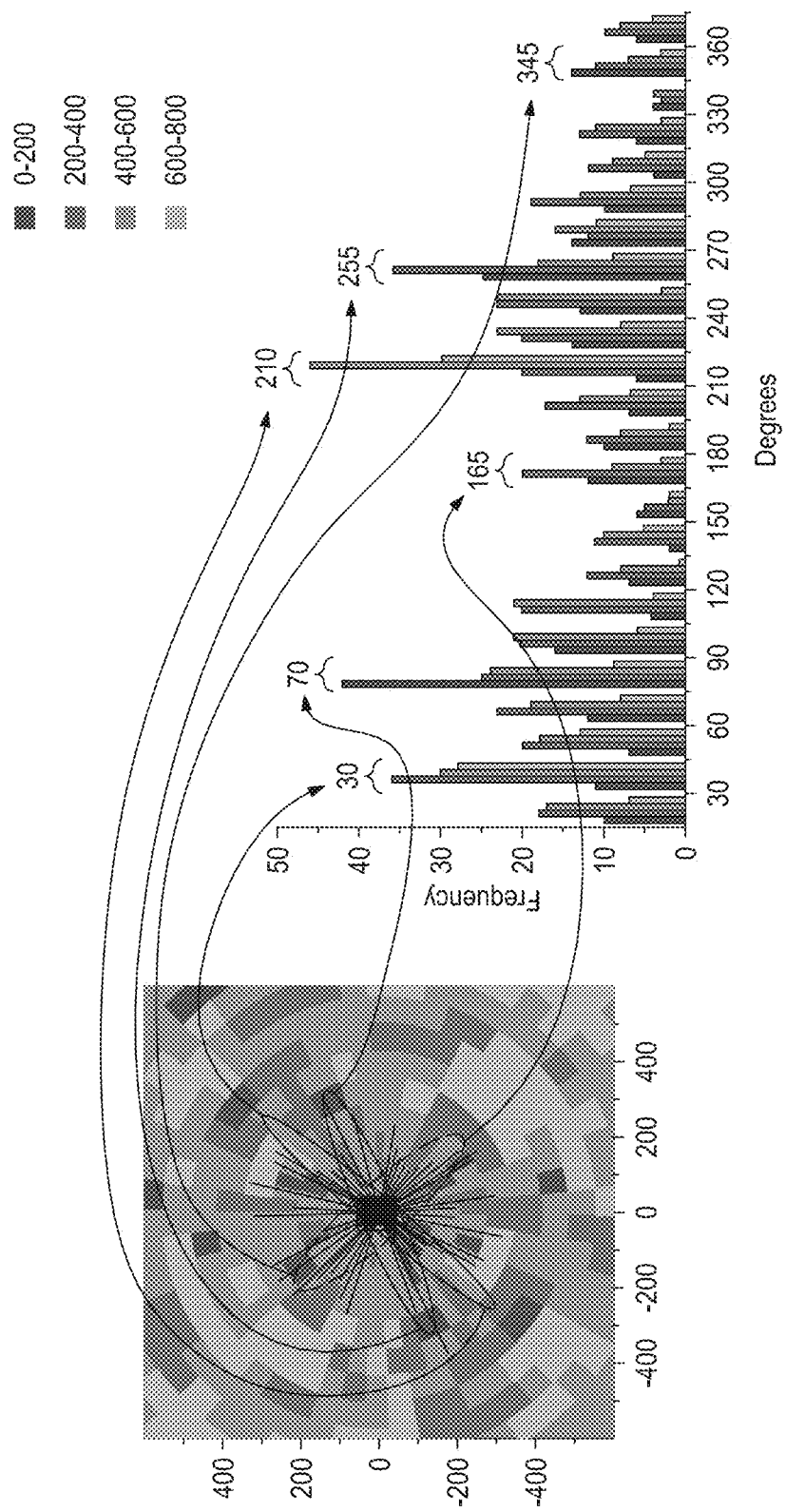
FIG. 8 is an expanded view of the FIG. 5 polar plot and the 2-dimensional representation of the FIG. 7 strike azimuth.

FIG. 8 is an expanded view of the FIG. 5 polar plot derived from microseismic data 114 and the 2-deminsional representation of the FIG. 7 strike azimuth derived from borehole image measured data 106. The polar plot is overlayed with ovals that indicate the directions of continuity identified by the geostatistical analysis, which as indicated by the overlayed arrows, correlates to the strike azimuth data derived from the borehole image measured data 106. Therefore, the modeled fractures extending in these correlated directions are more likely than fractures that do not have a correlation between the measured data 106 and the microseismic data 114.

Figure 9:
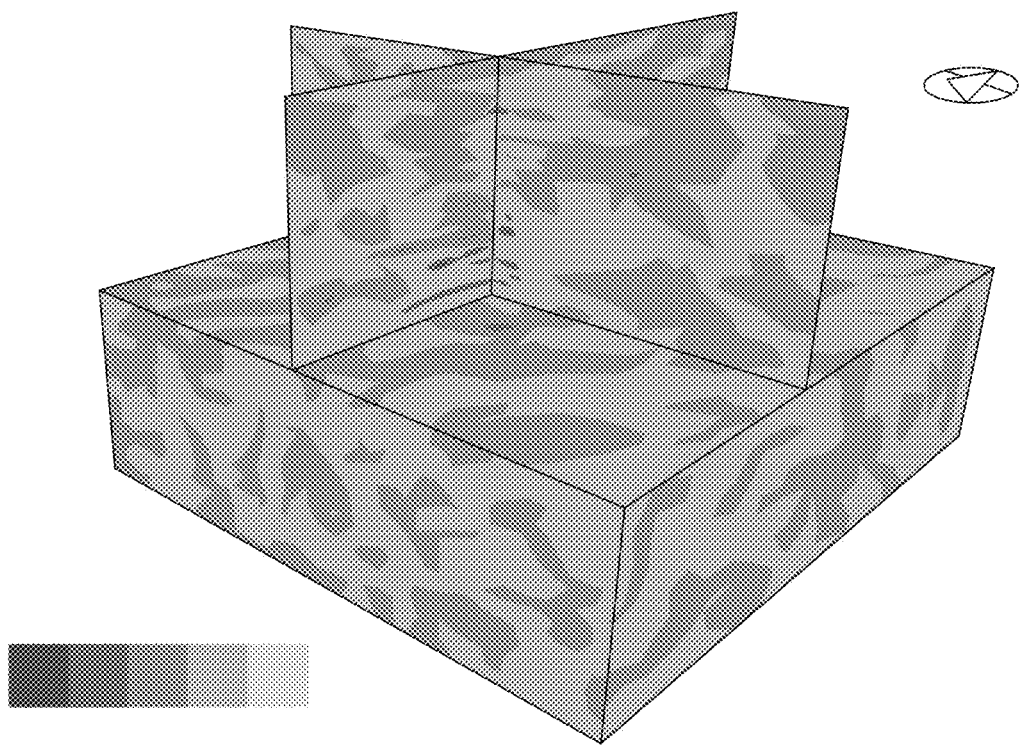
FIG. 9 is a geocellular grid representation of the microseismic-weighted (MSW) complex fracture network map.
Figure 10:
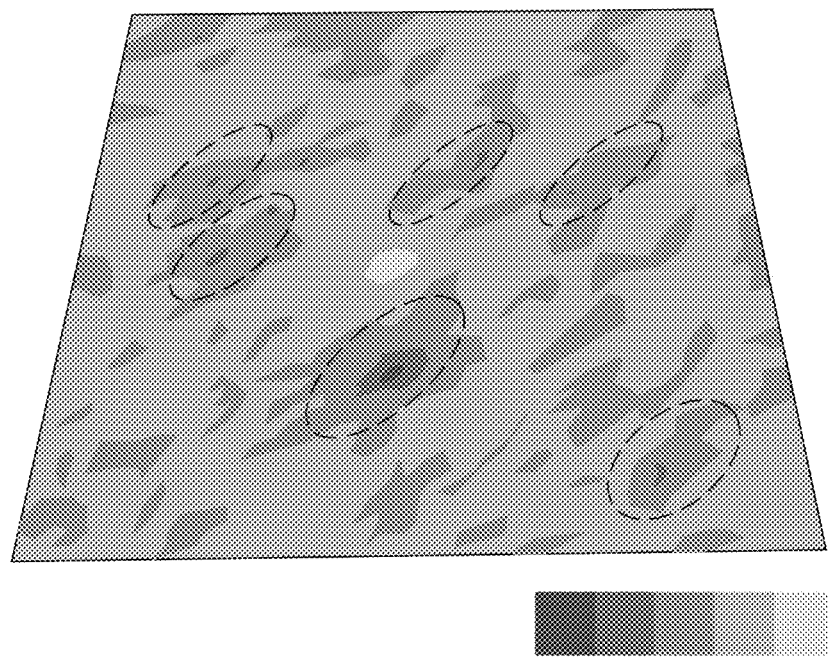
FIG. 10 is a single plane within the MSW complex fracture network map of FIG. 9.
Figure 11:
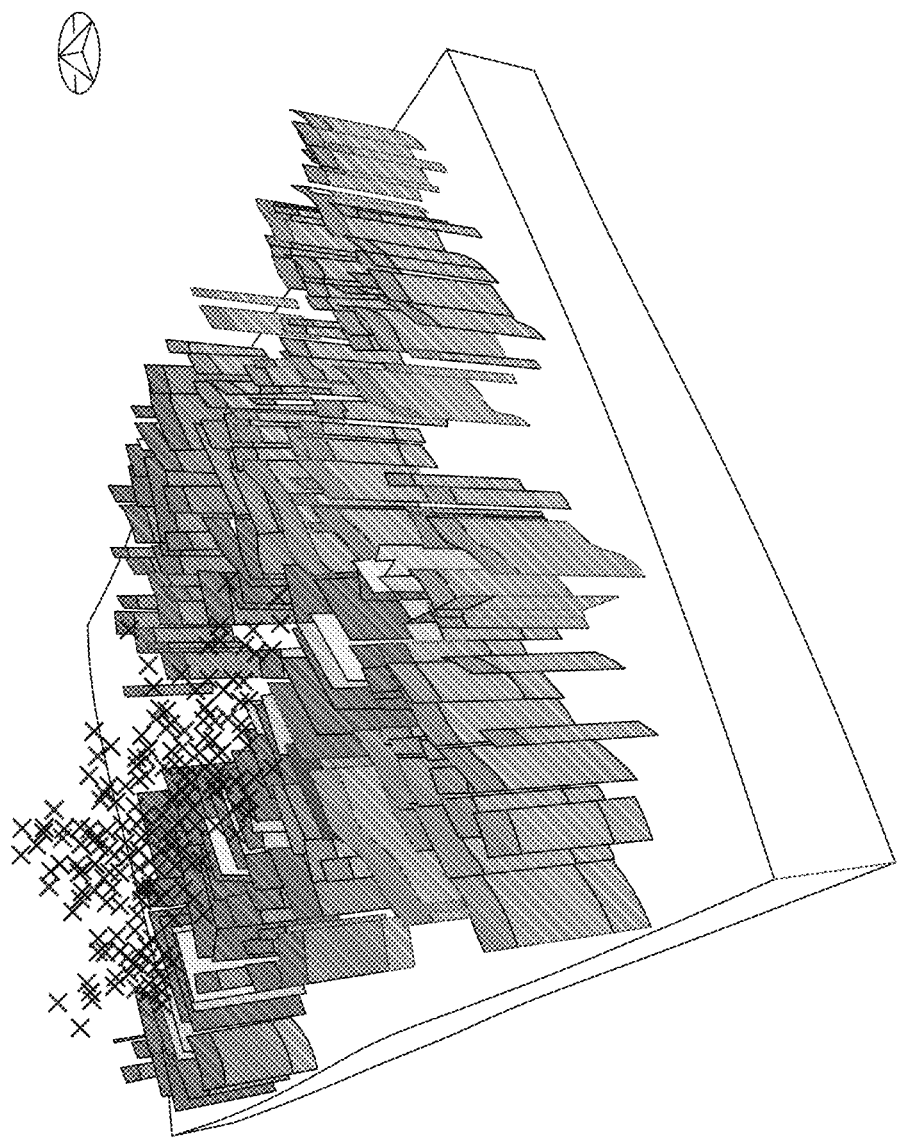
FIG. 11 is an alternative view of the MSW complex fracture network map.

The mathematical model 100 described herein was then used to simulate or otherwise produce a MSW complex fracture network map 116 where the correlations described in FIG. 8 are weighted as having higher likelihood of a fracture being present. FIG. 9 is a geocellular grid representation of the MSW complex fracture network map 116, and FIG. 10 is a single plane within the MSW complex fracture network map 116 of FIG. 9. In FIG. 10, the areas where fractures are most likely are outlined with overlayed ovals. Note the direction of the ovals are similar, which indicates the fracture may extend in this direction. FIG. 11 is alternate view of geocellular grid representation of the MSW complex fracture network map 116 where the background or unlikely fracture locations are removed to illustrate the likely fracture planes to more adequately see in a 3-dimensional view the fracture likelihood in the MSW complex fracture network map 116. FIG. 11 also overlays the location of the microseismic events, which correlates strongly to the location and direction of the most likely fracture in this view.

The MSW complex fracture network map 116 may then be used for estimating the hydrocarbon production of the subterranean formation, identifying a location for drilling a second wellbore, determining the parameters of a subsequent fracturing treatment, performing the mathematical model 100 again, and the like, and any combination thereof.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A method comprising:
receiving, by a computing device from a wellbore tool placed along a wellbore extending into a subterranean formation, well log data collected by the wellbore tool for different points of the subterranean formation surrounding the wellbore, the well log data including measurements of one or more properties of the subterranean formation that relate to fractures within the subterranean formation;
generating, by the computing device, a first geocellular grid representing a natural fracture network map of the subterranean formation, based on the well log data collected by the wellbore tool prior to a fracturing treatment of the subterranean formation, wherein the first geocellular grid includes a plurality of cells, and each cell of the plurality of cells represents the well log data collected for a corresponding point of the subterranean formation;
generating, by the computing device, a second geocellular grid representing a complex fracture network map of the subterranean formation, based on the first geocellular grid and additional well log data collected by the wellbore tool for the different points of the subterranean formation during the fracturing treatment along a first portion of the wellbore within the subterranean formation;
receiving, by the computing device from one or more sensors, microseismic data collected by the one or more sensors for the different points of the subterranean formation during the fracturing treatment along the first portion of the wellbore within the subterranean formation;
calculating, by the computing device, a variogram representing the microseismic data collected by the one or more sensors for the different points of the subterranean formation as a function of spatial location;
identifying, by the computing device, directions of continuity in the microseismic data by applying the variogram to the microseismic data;
correlating, by the computing device, the directions of continuity identified in the microseismic data to fracture locations in the complex fracture network map to produce a microseismic-weighted (MSW) complex fracture network map of the subterranean formation, the fracture locations corresponding to cells of the second geocellular grid representing one or more fracture planes within the complex fracture network map;
determining, by the computing device, parameters for a subsequent fracturing treatment of the subterranean formation along a second portion of the wellbore, based on the MSW complex fracture network map; and
controlling, by the computing device, the subsequent fracturing treatment of the subterranean formation along the second portion of the wellbore using the determined parameters.

2. The method of claim 1, wherein the MSW complex fracture network map is represented as a 3-dimensional grid matrix of the subterranean formation.

3. The method of claim 1 further comprising:
developing a parameter of a subsequent wellbore operation based on the MSW complex fracture network map.

4. The method of claim 1 further comprising:
identifying a location in the MSW complex fracture network map for drilling a second wellbore into the subterranean formation.

5. The method of claim 1 further comprising:
estimating a hydrocarbon production amount based on the MSW complex fracture network map.

6. The method of claim 1, wherein the directions of continuity in the microseismic data are represented as a polar plot of semivariance derived from the microseismic data.

7. The method of claim 1, further comprising:
receiving, by the computing device from the wellbore tool placed along the wellbore extending into the subterranean formation, subsequent well log data from the subsequent fracturing treatment of the subterranean formation along the second portion of the wellbore;
generating, by the computing device, a third geocellular grid representing a second complex fracture network map of the subterranean formation, based on the MSW complex fracture network map and the subsequent well log data of the subterranean formation;
receiving, by the computing device from the one or more sensors, subsequent microseismic data collected by the one or more sensors during the subsequent fracturing treatment along the second portion of the wellbore within the subterranean formation;
identifying, by the computing device, second directions of continuity in the subsequent microseismic data by applying the variogram to the subsequent microseismic data; and
correlating, by the computing device, the second directions of continuity identified in the subsequent microseismic data to fracture locations in the second complex fracture network map to produce a second MSW complex fracture network map of the subterranean formation.

8. The method of claim 1, wherein the well log data includes one or more of seismic data, gravimetric data, magnetic data, and magnetotelluric data.

9. The method of claim 1, wherein generating the first geocellular grid representing the natural fracture network map involves calculating a fault likelihood of the subterranean formation, based on the well log data collected by the wellbore tool prior to the fracturing treatment.

10. A system comprising:
a wellbore tool placed along a wellbore extending into a subterranean formation;
a non-transitory computer-readable medium coupled to the wellbore tool to obtain well log data of the subterranean formation from the wellbore tool and encoded with instructions that, when executed by a processor, perform a method comprising:
receiving, from the wellbore tool, well log data collected by the wellbore tool for different points of the subterranean formation surrounding the wellbore, the well log data including measurements of one or more properties of the subterranean formation that relate to fractures within the subterranean formation;
generating a first geocellular grid representing a natural fracture network map of the subterranean formation, based on the well log data collected by the wellbore tool prior to a fracturing treatment of the subterranean formation, wherein the first geocellular grid includes a plurality of cells, and each cell of the plurality of cells represents the well log data collected for a corresponding point of the subterranean formation;
generating a second geocellular grid representing a complex fracture network map of the subterranean formation, based on the first geocellular grid and additional well log data collected by the wellbore tool for the different points of the subterranean formation during the fracturing treatment along a first portion of the wellbore within the subterranean formation;
receiving, from one or more sensors, microseismic data collected by the one or more sensors for the different points of the subterranean formation during in the fracturing treatment along the first portion of the wellbore within the subterranean formation;
calculating a variogram representing the microseismic data collected by the one or more sensors for the different points of the subterranean formation as a function of spatial location;
identifying directions of continuity in the microseismic data by applying the variogram to the microseismic data;
correlating the directions of continuity identified in the microseismic data to fracture locations in the complex fracture network map to produce a microseismic-weighted (MSW) complex fracture network map of the subterranean formation, the fracture locations corresponding to cells of the second geocellular grid representing one or more fracture planes within the complex fracture network map;
determining parameters for a subsequent fracturing treatment of the subterranean formation along a second portion of the wellbore, based on the MSW complex fracture network map; and
controlling, the subsequent fracturing treatment of the subterranean formation along the second portion of the wellbore using the determined parameter.

11. The system of claim 10, wherein the MSW complex fracture network map is represented as a 3-dimensional grid matrix of the subterranean formation.

12. The system of claim 10, wherein the instructions that, when executed, perform the method that further comprise:
developing a parameter of a subsequent wellbore operation based on the MSW complex fracture network map.

13. The system of claim 10, wherein the instructions that, when executed, perform the method that further comprise:
identifying a location in the MSW complex fracture network map for drilling a second wellbore into the subterranean formation.

14. The system of claim 10, wherein the instructions that, when executed, perform the method that further comprise:
estimating a hydrocarbon production amount based on the MSW complex fracture network map.

15. The system of claim 10, wherein the directions of continuity in the microseismic data are represented as a polar plot of semivariance derived from the microseismic data.

16. The system of claim 10, wherein the instructions that, when executed, perform the method that further comprise:
receiving, from the wellbore tool, subsequent well log data from the subsequent fracturing treatment of the subterranean formation along the second portion of the wellbore;
generating a third geocellular grid representing a second complex fracture network map of the subterranean formation based on the MSW complex fracture network map and the subsequent well log data of the subterranean formation;
receiving from the one or more sensors, subsequent microseismic data collected by the one or more sensors during the subsequent fracturing treatment along the second portion of the wellbore within the subterranean formation;
identifying second directions of continuity in the subsequent microseismic data by applying the variogram to the subsequent microseismic data; and
correlating the second directions of continuity identified in the subsequent microseismic data to fracture locations in the second complex fracture network map to produce a second MSW complex fracture network map of the subterranean formation.

17. A non-transitory computer-readable medium encoded with instructions that, when executed by a processor, perform a method comprising:
receiving, from a wellbore tool placed along a wellbore extending into a subterranean formation, well log data collected by the wellbore tool for different points of the subterranean formation surrounding the wellbore, the well log data including measurements of one or more properties of the subterranean formation that relate to fractures within the subterranean formation;
generating a first geocellular grid representing a natural fracture network map of the subterranean formation, based on the well log data collected by the wellbore tool prior to a fracturing treatment of the subterranean formation, wherein the first geocellular grid includes a plurality of cells, and each cell of the plurality of cells represents the well log data collected for a corresponding point of the subterranean formation;
generating a second geocellular grid representing a complex fracture network map of the subterranean formations based on the first geocellular grid and additional well log data collected by the wellbore tool for the different points of the subterranean formation during the fracturing treatment along a first portion of the wellbore within the subterranean formation;
receiving from one or more sensors, microseismic data collected by the one or more sensors for the different points of the subterranean formation during the fracturing treatment along the first portion of the wellbore within the subterranean formation; calculating a variogram representing the microseismic data collected by the one or more sensors for the different points of the subterranean formation as a function of spatial location;

identifying directions of continuity in the microseismic data by applying the variogram to the microseismic data;

correlating the directions of continuity identified in the microseismic data to fracture locations in the complex fracture network map to produce a microseismic-weighted (MSW) complex fracture network map of the subterranean formation, the fracture locations corresponding to cells of the second geocellular grid representing one or more fracture planes within the complex fracture network map;

determining parameters for a subsequent fracturing treatment of the subterranean formation along a second portion of the wellbore, based on the MSW complex fracture network map; and controlling, the subsequent fracturing treatment of the subterranean formation is performed along the second portion of the wellbore using the determined parameters.

18. The non-transitory computer-readable medium of claim 17, wherein the MSW complex fracture network map is represented as a 3-dimensional grid matrix of the subterranean formation.

19. The non-transitory computer-readable medium of claim 17, wherein the instructions that, when executed, perform the method that further comprise:

identifying a location in the MSW complex fracture network map for drilling a second wellbore into the subterranean formation.

20. The non-transitory computer-readable medium of claim 17, wherein the instructions that, when executed, perform operations that further comprise:

receiving, from the wellbore tool placed along the wellbore extending into the subterranean formation, subsequent well log data from the subsequent fracturing treatment of the subterranean formation along the second portion of the wellbore;

generating a third geocellular grid representing a second complex fracture network map of the subterranean formation, based on the MSW complex fracture network map and the subsequent well log data of the subterranean formation;

receiving, from the one or more sensors, subsequent microseismic data collected by the one or more sensors during the subsequent fracturing treatment along the second portion of the wellbore within the subterranean formation;

identifying second directions of continuity in the subsequent microseismic data by applying the variogram to the subsequent microseismic data; and correlating the second directions of continuity identified in the subsequent microseismic data to fracture locations in the second complex fracture network map to produce a second MSW complex fracture network map of the subterranean formation.

* * * * *